(12) United States Patent
Tsuboi

(10) Patent No.: US 6,307,817 B1
(45) Date of Patent: Oct. 23, 2001

(54) MAGNETIC RECORDING MEDIUM THERMAL STABILITY MEASURING METHOD AND THERMAL STABILITY MEASURING APPARATUS

(75) Inventor: Shinzo Tsuboi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/115,603

(22) Filed: Jul. 15, 1998

(30) Foreign Application Priority Data

Jul. 18, 1997 (JP) .................................................. 9-194240

(51) Int. Cl.[7] .................................................. G11B 11/00
(52) U.S. Cl. .................................................. 369/13
(58) Field of Search .................... 369/13, 59.1, 116, 369/53.2, 47.1, 47.15; 430/48, 55; 428/694 TF

(56) References Cited

U.S. PATENT DOCUMENTS 5,571,646 * 11/1996 Ulsumi et al. ........................ 430/48
5,631,887 * 5/1997 Hurst, Jr. ................................ 369/59

FOREIGN PATENT DOCUMENTS 50-3604   1/1975  (JP).
5-314707  11/1993 (JP).

OTHER PUBLICATIONS

Lu et al., "Thermal Instability at 10 Gbit/in$^2$ Magnetic Recording", IEEE Transactions on Magnetics, vol. 30, No. 6, Nov. 1994, pp. 4230–4232.

Logothetis et al., "Tandem Deposition of Small Metal Particle Composites", Journal of Applied Physics, vol. 60, No. 7, Oct. 1, 1986, American Institute of Physics pp. 2548–2552.

Sato et al., "Thermal Stability of Perpendicular Recorded Information", Fujitsu Limited, pp. 187–191.

* cited by examiner

Primary Examiner—Ali Neyzari
(74) Attorney, Agent, or Firm—Young & Thompson

(57) ABSTRACT

A thermal stability measuring method for a magnetic recording medium includes heating the magnetic recording medium, reproducing an information recorded on the magnetic recording medium, and measuring a thermal stability according to a reproduction output during the heating.

7 Claims, 10 Drawing Sheets

MAGNETIC RECORDING MEDIUM THERMAL STABILITY MEASURING METHOD AND THERMAL STABILITY MEASURING APPARATUS

BACKGROUND OF THE INVENTION

1. Field of the Invention

The present invention relates to a method for measuring a thermal stability of a high-density information magnetic recording medium and a thermal stability measuring apparatus.

2. Description of the Prior Art

Conventionally, recording and reproduction are widely carried out by using a magnetic recording medium such as a magnetic disc. In order to increase an information amount recorded on a magnetic recording medium, it is desired to carry out recording with a high density, which in turn requires a magnetic recording medium having a low noise characteristic. In order to achieve a low noise, it is necessary to reduce the crystal particle size of the magnetic film of the magnetic recording medium. However, when the crystal particle size is decreased to a certain level, there arise a problem of thermal fluctuation which lowers the magnetization stability. That is, if a recording or reproduction is carried out onto/from a magnetic recording medium under a high temperature, the magnetization becomes unstable, disabling to record or reproduce correctly.

In general, as a index representing stability of crystal particles constituting a magnetic film, $KuV/kT$ is used, wherein $Ku$ represents a magnetic anisotropic energy; $V$ represents a crystal particle volume; $k$, a Boltzmann's constant; and $T$, temperature. This is clearly described in "Thermal instability at 10 Gbit/in$^2$ magnetic recording", IEEE Transaction on magnetics, No. 30, pp. 4230 to 4232, 1994. According to the Arrhenius' equation, when $KuV/kT=25$, magnetization of $1/e$ (wherein e is a natural exponential) is obtained for 100 seconds. If the $KuV/kT$ exceed s this value, the magnetic film shows superparamgnetism. That is, $KuV/kT=25$ is a critical value. This is described in the article "Tandem deposition of small metal particle composites" in Journal of Applied Physics, No. 60, p.2548, 1986.

Thus, a $KuV/kT$ value serves as an index representing stability. The $k$ is a constant and the $Ku$ and $V$ values are determined by the magnetic film characteristics, and the like. The $KuV/kT$ value is changed according to a temperature $T$. More specifically, as the temperature $T$ increases, the $KuV/kT$ values decreases, lowering magnetization stability. Although the $KuV/kT=25$ is a critical value of superparamagnetism, the $KuV/kT$ should be a greater value for practical use as an actual magnetic recording medium. Accordingly, it is desired to determine a practical temperature range for respective recording media.

The practical temperature range can be determined through evaluation of thermal stability (thermal fluctuation). For example, there can be considered a method of placing a magnetic recording/reproduction apparatus such as a hard disc drive (HDD) in an electric furnace, temperature of which is gradually increased while detecting a reproduction output from a magnetic recording medium. However, if the temperature is increased, a magneto-resistance (MR) head changes its characteristics. For example, the MR ratio (ratio of an absolute value of resistance with respect to a resistance change due to magnetism) is decreased and an adhesive is peeled out. Thus, there arise problems inside the HDD and it is difficult to directly evaluate the thermal stability.

To cope with this, there have been suggested some methods for checking the affect to the thermal stability: a method of checking a coercive force dependency on the temperature; and a method using the magnetic force microscopy (MFn). These method s are both disclosed in the article "Thermal stability of perpendicularly recorded information" In Japan Applied Magnetics Association periodical, Vol. 21, Supplement No. S1 (5$^{th}$ perpendicular magnetic recording symposium), pp. 187–191.

The method to determine a coercive force dependency on the temperature to measure the thermal stability is realized by measuring the coercive force in a temperature range of absolute temperature of 100 to 500 K so as to determine the temperature change ratio of the coercive force.

In the method using the MFM, a sample (magnetic recording medium) on which a recording magnetic pattern has been formed is heated, for example, at the temperature of 200 C. for 3 hours, after which an observation with the MFM is carried out. An MFM output observed immediately after a magnetic recording is compared to an MFM output after the three hours of heating to determine an attenuation quantity.

However, in the method of determining the coercive force dependency on the temperature, no actual reproduction is carried out from a magnetic recording and it is impossible to determine a thermal affect to a reproduction signal. Moreover, the coercive force temperature change ratio obtained by this method includes an affect from the crystal orientation and accordingly, it is impossible to determine the thermal stability itself. Furthermore, the coercive force is determined by gradually increasing the magnetic field applied to the magnetic recording medium until magnetism disappears. Even if an information is recorded with a particular recording density, demagnetization is caused by a great magnetic field (such as 5 to 15 kOe).

On the other hand, the measuring method using the MFM has problems as follows.

The main problem is that in this measuring method, the MFM output is determined for a magnetic recording medium not in a heated state to a high temperature but in a state cooled to a certain level when the affect from the heat is mitigated. This is because it is impossible to carry out an MFM measurement while the magnetic recording medium is at a high temperature with unstable magnetization. The recording is changed from a stable first state at a room temperature to an unstable second state at a high temperature and then returned to a quasi-stable third state at a room temperature when the MFM measurement is carried to compare the first state to the third state. That is, the unstable second state having the greatest problem in thermal stability is not subjected to the MFM measurement. It is impossible to use the temperature o the second state heated to a high temperature as the absolute temperature $T$ of the thermal stability index $KuV/kT$. Accordingly, with this measurement method, it is impossible to evaluate the thermal stability in the state (second state) of a great absolute temperature $T$ and a small thermal stability index $KuV/kT$.

Because the MFM measurement is carried out not in the second state of unstable magnetization at a high temperature but in the third state of quasi-stable magnetization, there is little difference from the first state of stable magnetization prior to the heating. Even after the second state of unstable magnetization due to a high temperature, there is almost no difference in the MFM output between the third state at a room temperature and the first state. Accordingly, judging from the results of this measurement, it cannot be seen that heating causes thermal instability. That is, it is difficult to detect this instability by employing this measurement method.

SUMMARY OF THE INVENTION

It is therefore an object of the present invention to provide a magnetic recording medium thermal stability measuring method for measuring directly and with a high accuracy a thermal stability of a magnetic recording medium as well as a thermal stability measuring apparatus.

DETAILED DESCRIPTION OF PREFERRED EMBODIMENTS

Hereinafter, description will be directed to preferred embodiments of the present invention with reference to the attached drawings.

Figure 1:
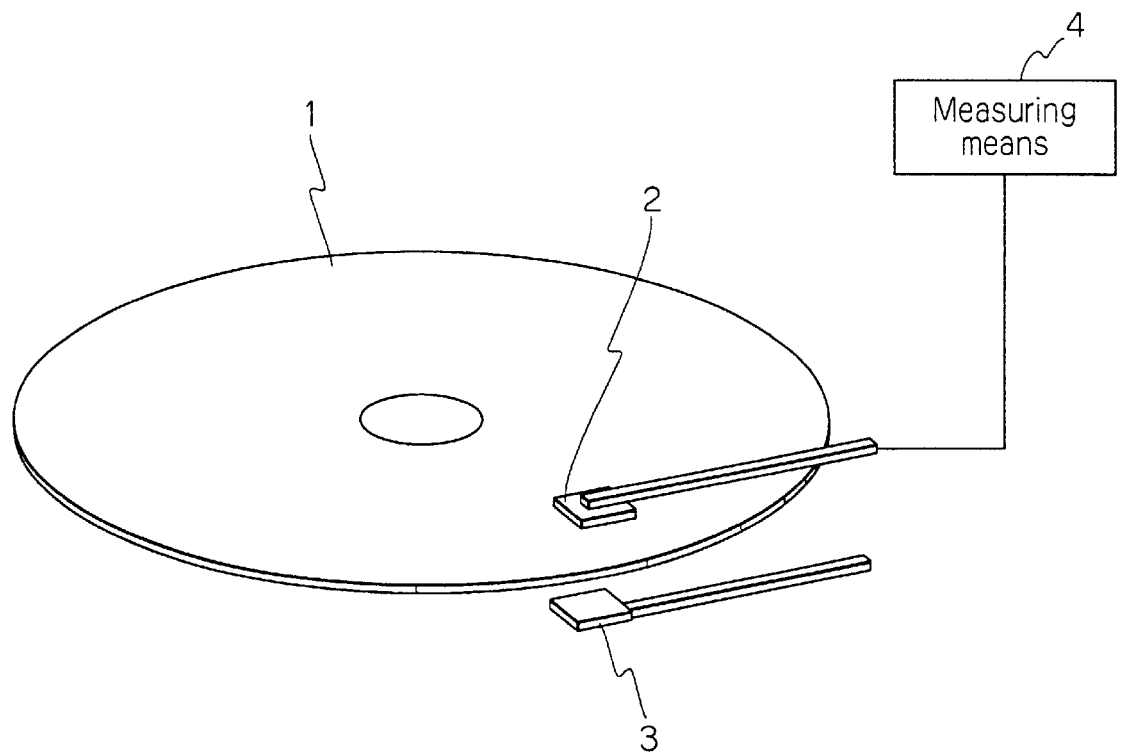
FIG. 1 is a perspective view showing a thermal stability measuring apparatus for a magnetic recording medium having a light-transmitting type substrate such as a glass substrate.

In a first embodiment, the object used for the thermal stability measurement is a single-sided magnetic recording medium (magnetic disc) 1 having a magnetic film on one side of a substrate which transmits light such as a glass substrate. As shown in FIG. 1 the magnetic recording medium 1 is sandwiched between a reproduction head (magnetic head) 2 capable of recording/reproduction and a magneto-optical head (heading means) 3 capable of partially heating the magnetic recording medium 1 by way of laser radiation. The reproduction head 2 and the magneto-optical head 3 can be respectively adjusted in their positions. It should be noted that the reproduction head 2 used here may be either an inductive head of self recording type or an ID (inductive)/MR (magneto-resistance) composite type head in which a recording block and a reproduction block are provided separately from each other.

Prior to carrying out a thermal stability measurement, it is necessary to firstly position the reproduction head 2 and the magneto-optical head 3 at an identical radial position (at an identical track position). The positioning of these heads 2 and 3 are carried out as follows.

When evaluating the magnetic recording medium 1 having the magnetic film only on one side of the substrate allows light to come from the opposite side, the reproduction head 2 is located on the side having the magnetic film, whereas the magneto-optical head 3 is located on the opposite side so that both of the heads 2 and 3 are positioned almost at an identical radial position. For this positioning the heads 2 and 3 in an identical radial position (track position), a correction should be made.

For this correction, firstly, a recording pattern is formed by using the reproduction head 2 capable of magnetic recording over a wide area (several $\mu$m to several mm) of the magnetic recording medium 1. This pattern may be a recording pattern such as a periodical signal and a random pattern. Next, a laser beam is applied from the magneto-optical head 3 onto the magnetic recording medium 1. Here, the current introduced to a laser diode (not depicted) of the magneto-optical head 3 is controlled so as to head the surface of the magnetic recording medium 1 to 300° C. or above so that the magnetic information at the portion radiated by the laser beam is lost. The magneto-optical head 3 is kept unmoved from this position.

In this state, the reproduction head 2 is operated to scan so as to reproduce the recording area where the magnetic recording pattern has been formed. The reproduction output abruptly drops at the track position where the magnetic information is lost due to heating. That is the track position of the magneto-optical head 3, and the reproduction head is stopped at this position. Thus, it is possible to match the radial position (track position) of the reproduction head 2 and that of the magneto-optical head 3.

Next, description will be directed to a thermal stability measurement procedure.

As has been described above, in this first embodiment, the magneto-optical head 3 is used as heating means for making the magnetization of the magnetic recording medium thermally unstable. The heating temperature is controlled by changing the current supplied to the laser diode (not depicted) of the magneto-optical head 3. Because the temperature of the magnetic recording medium 1 changes depending on the substrate, it is necessary to carry out simulation in advance and make a correction to obtain an accurate temperature.

In a case when the magnetization of the magnetic film of the magnetic recording medium 1 has been completely lost due to the heating in the positioning, the reproduction head 2 and the magneto-optical head 3 are off-tracked with an identical amount.

Firstly, an arbitrary recording magnetization pattern is formed on the magnetic recording medium 1 by using the reproduction head 2 capable of magnetic recording. This magnetic recording is reproduced by using the reproduction head 2 so that a reproduction output is determined by measuring means.

Next, a laser beam is applied from the magneto-optical head 3 to heat the magnetic recording medium 1. Here, the heating temperature is controlled by controlling the current flowing to the laser diode (not depicted) and the laser focusing spot diameter. The magneto-optical head focus spot diameter can be changed in a range from several $\mu$m to sub $\mu$m.

By measuring the reproduction output while carrying out the heating processing, it is possible to determine the reproduction output attenuation amount due to the heat. This reproduction output attenuation amount serves as the index indicating the thermal stability of the magnetic recording medium 1. Thus, recording/reproduction is carried out while the recording medium is heated from the opposite side of the substrate by using the magneto-optical head 3 and the reproduction output attenuation is measured so as to determine the thermal instability. In this method, the reproduction output can be directly measured both at a stable room temperature and at an unstable high temperature, enabling to accurately determine the thermal stability.

Figure 2:
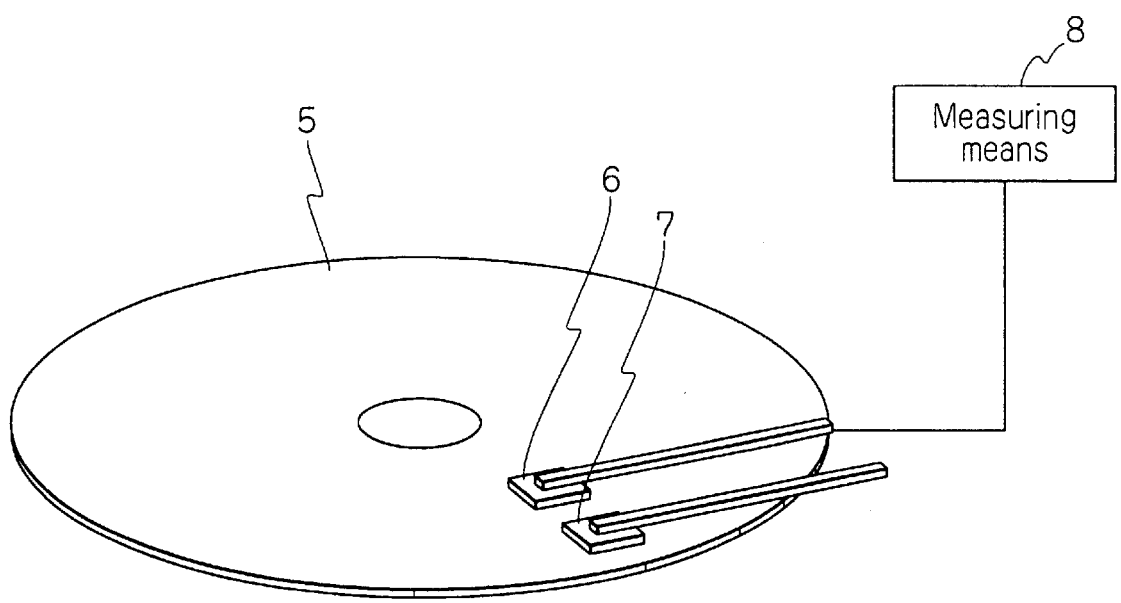
FIG. 2 is a perspective view showing a thermal stability measuring apparatus for a magnetic recording medium having a substrate not transmitting light.

FIG. 2 shows as a second embodiment of the present invention, a configuration of a thermal stability measurement of a magnetic recording medium 5 having a magnetic film formed on a substrate not transmitting a laser beam such as NiP/Al substrate or magnetic films formed on both sides of the substrate. In this case, a reproduction head 6 and a magneto-optical head 7 are arranged on the same side of the magnetic recording medium 5.

The reproduction head and the magneto-optical head 7 are positioned in the same way as in the aforementioned first embodiment. However, because the heads 6 and 7 are arranged on the same side of the magnetic recording medium 5, the heads 6 and 7 are positioned apart from each other by a size of the head (slider).

After this track position matching, the heads 6 and 7 are moved to an arbitrary track position for carrying out a thermal stability measurement. That is, in the same way as in the aforementioned method, a magnetic recording is reproduced by the reproduction head 6 and a reproduction output is measured with measuring means 8 while the magnetic recording medium 5 is heated by the magneto-optical head 7 arranged on the same side as the reproduction head, so as to determine a thermal stability.

By changing the periodicity of the pattern to be recorded at first, it is possible to determine a thermal stability dependency on the recording density. Furthermore, it is also determine an AC demagnetization and a DC demagnetization in the same way.

Moreover, by using a laser beam of a short wavelength so as to reduce a focusing spot diameter and using a reproduction head having track width equal to or smaller than the focusing spot diameter, it is possible to carry out measurement while moving the measurement position in the track radial direction so as to detect a thermal stability distribution in the track radial direction.

It should be noted that as has been described above, even if the magnetic recording medium is head so as to make the magnetization unstable, the unstable state is mitigated with the time lapse. Accordingly, when the reproduction head 6 and the magneto-optical head 7 are arranged on the same side of the magnetic recording medium 4 and the heads 6 and 7 are located in different positions in the circumferential direction of the magnetic recording medium 4, the unstable state caused by heat is mitigated to some extent when the thermal stability is determined. To cope with this, the distance between the two heads in the circumferential direction is controlled while the thermal stability measurement is carried out, thus enabling to determine the mitigated state of the instability.

EXAMPLES

Next, description will be directed to specific examples of measurement.

Example 1

Example 1 used as the magnetic recording medium 1 a CoCrPtTa/Cr longitudinal glass substrate medium (3.5-inch magnetic disc) including a Cr layer (under layer) and a CoCrPtTa layer (magnetic film) formed on a glass substrate. The medium had a coercive force of 2400 Oe and Brδ equal to 120 G$\mu$m, wherein Br represents a residual magnetic flux density and δ, a magnetic film thickness.

The magnetic recording/reproduction head 2 used was an ID/MR composite type head. The recording condition was as follows: circumferential velocity 12.7 m/sec; floating amount 45 nm; recording track width 4 $\mu$m with gap length 0.6 $\mu$m; reproduction track width 2 $\mu$m with gap length 0.3 $\mu$m; and recording current amplitude 20 mA$_{op}$.

Firstly, recording was carried out onto the magnetic recording medium 1 with a pitch (4 $\mu$m) equivalent to a recording track width and with 20 kFRPI (kilo flux reverse per inch) recording density, for example, over the entire area of 35–36 mm counted from the circumferential end. After this, while rotating the recording medium (magnetic disc), power of the reproduction head 2 and power of the magneto-optical head 3 (laser radiation head of wavelength 780 nm) were increased so as to apply a laser beam to the entire circumference of a particular track so as to heat the track, for example, up to 400° C. or above. This heating caused to lose the magnetic recording on the area which was subjected to the laser radiation by the magneto-optical head 3. At this stage, the magneto-optical head was stopped and the reproduction head 2 was caused to carry out scan to reproduce the magnetic recording from the magnetic recording medium 1. When the reproduction head 2 reached the track position of the 35–36 mm area of the magnetic recording medium 1 where the magnetic recording had disappeared, the measuring means 4 detected an abrupt drop of the reproduction output. At this stage, the magneto-optical head 3 which caused to lose the magnetic recording and the reproduction head 2 which detected the disappearance of the magnetic recording are at positions to oppose to each other. Thus, positioning of the magneto-optical head 3 and the reproduction head 2 in the track direction is complete.

It should be noted that this positioning can be carried out for any recording density and any recording pattern recorded at first. Moreover, it is not necessary to heat the recording medium to such an extent that the magnetic recording is completely lost. In order to carry out the positioning, it is sufficient to carry out heating to such an extent that the magnetization state of the medium is changed, lowering the output from the heated portion.

When the positioning was complete, measurement of a thermal stability was carried out. As has been described above, magnetization of the track position of 35–36 mm on the magnetic film had been lost by the heat and the reproduction head 2 and the magneto-optical head 3 were off-tracked by an identical amount (for example, 300 $\mu$m toward outer circumference).

Figure 3:
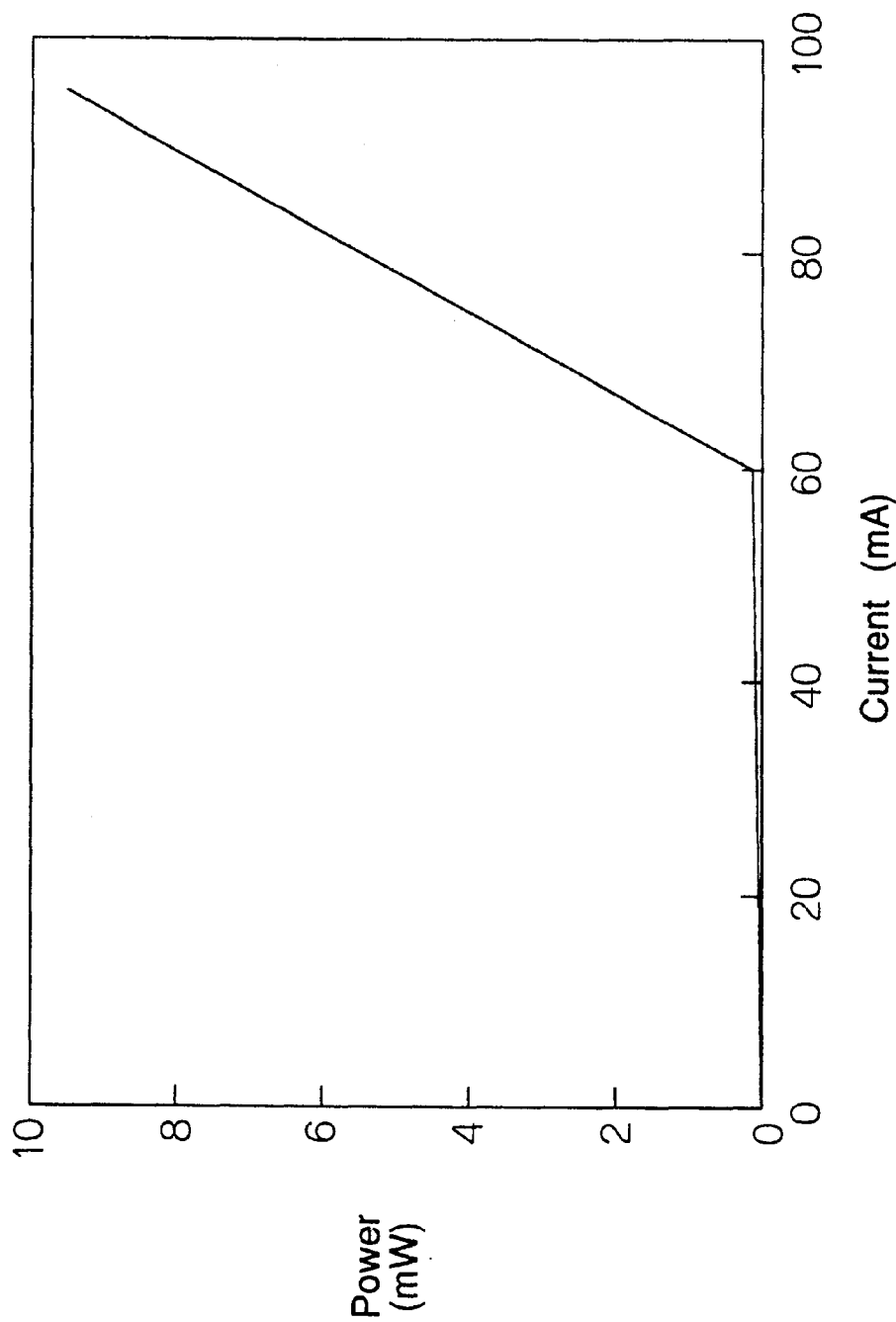
FIG. 3 shows a relationship between a current flowing to a laser diode and an optical output when a magneto-optical head used in Example 1 of the present invention has a focusing spot diameter of 2 $\mu$m.
Figure 4:
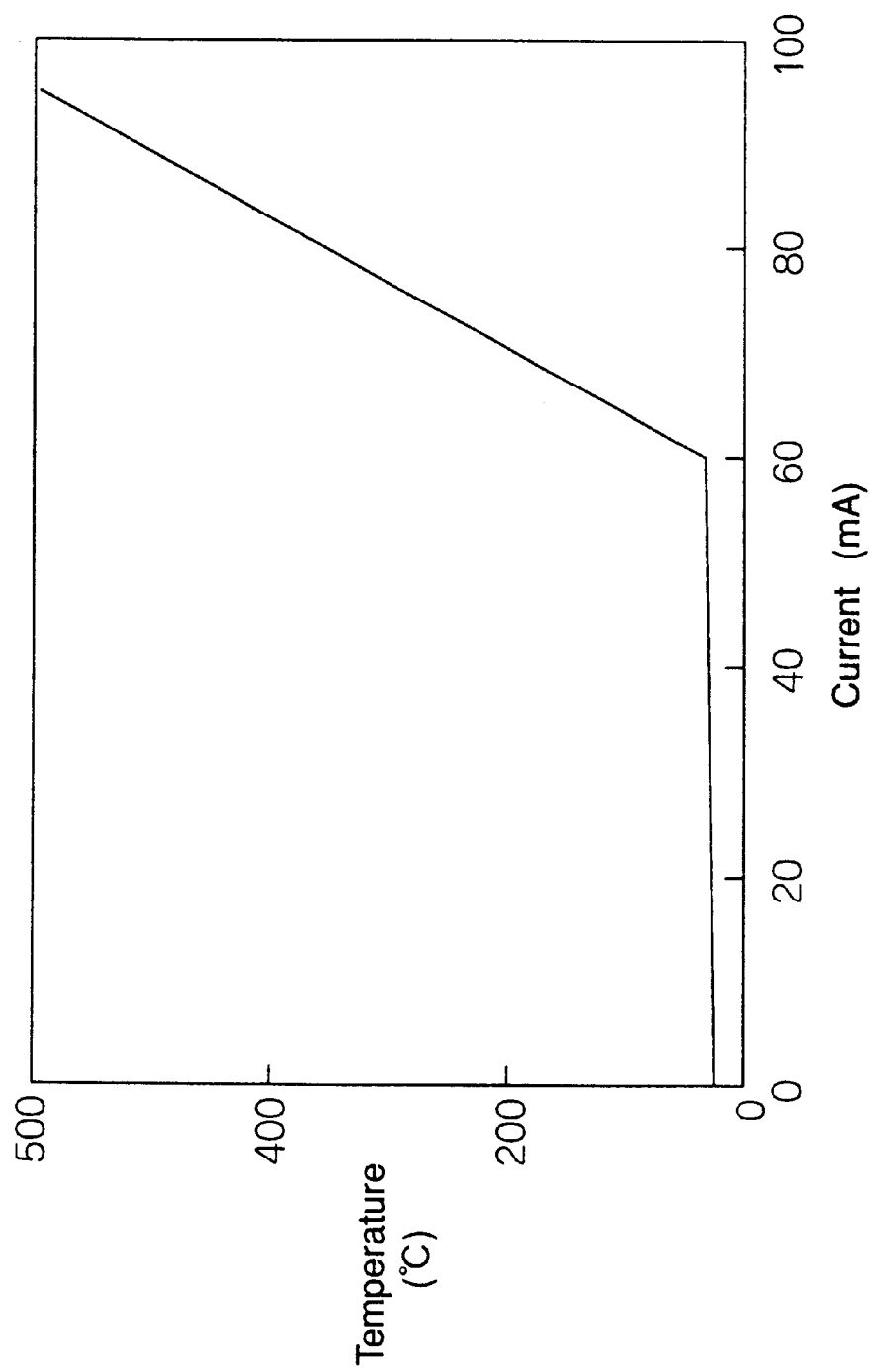
FIG. 4 shows a relationship between a current flowing to a laser diode and a temperature of the focus spot.

In this state, an information signal was recorded with a recording density 20 kFRPI on the magnetic recording medium 1. Next, the magnetic recording medium 1 was heated by the magneto-optical head 3. FIG. 3 shows a relationship between a current flowing to a laser diode and an optical output for the laser focus spot diameter 2 Am in this Example 1. Moreover, FIG. 4 shows a relationship between a current flowing to a photo diode and a spot center temperature. It should be noted that Example 1 used the magnetic recording medium having a glass substrate. When using a magnetic recording medium having other substrate such as a NiP/Al alloy substrate, its thermal conductivity should be taken into consideration for correcting the temperature.

Figure 5:
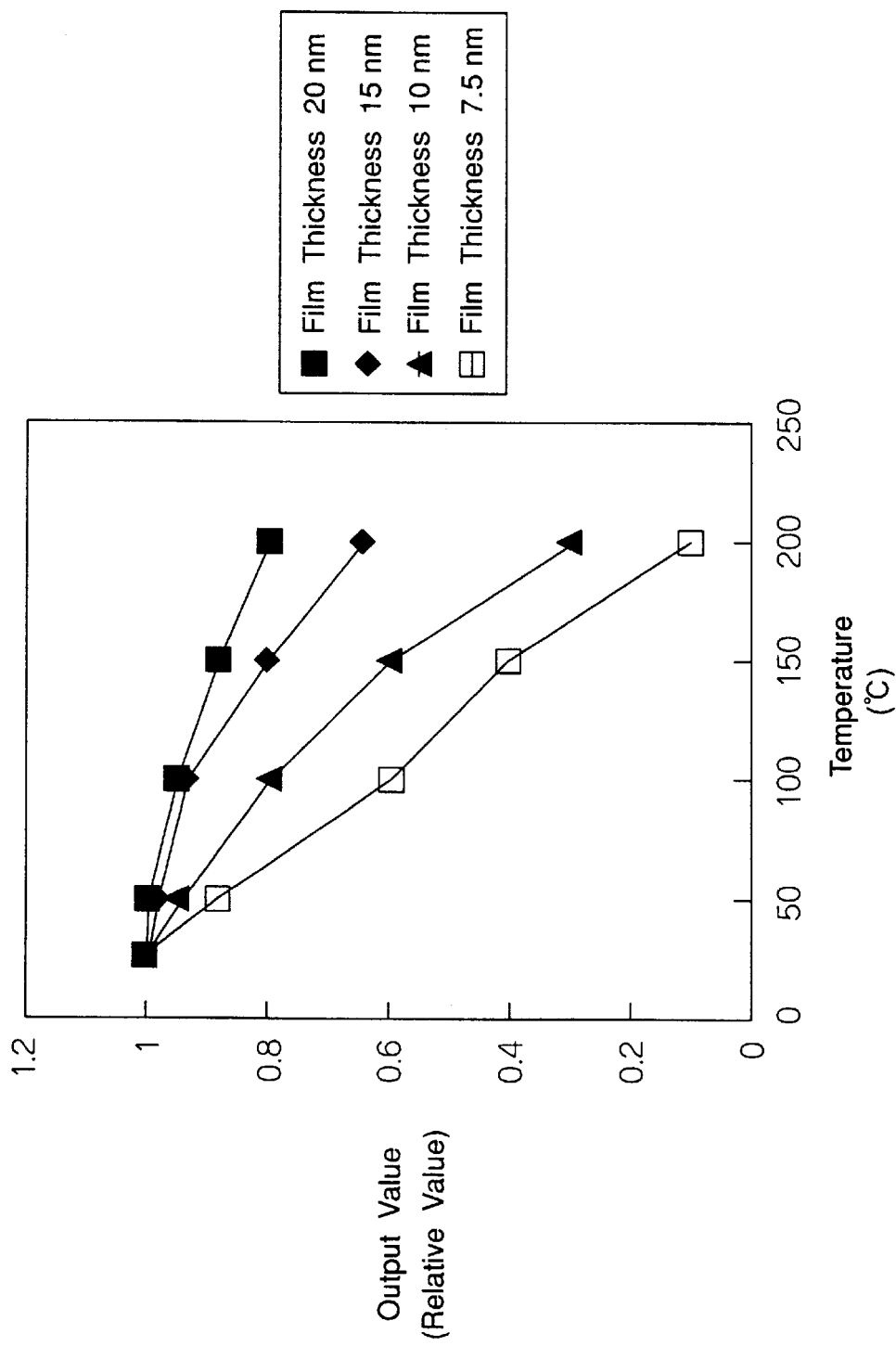
FIG. 5 shows results of thermal stability measurement in Example 1 as a relationship between a heating temperature and a reproduction output of respective magnetic film thickness values.

By using the thermal stability measuring apparatus according to the present embodiment, the thermal stability (reproduction output dependency on the temperature) was determined at the temperature of 50, 100, 150, and 200° C. That is, the magnetic recording medium was heated by the magneto-optical head 3 while the magnetic recording was reproduced by the reproduction head 2 so as to determine the reproduction output by the measuring means 4. FIG. 5 shows the thermal stability for different magnetic film thickness values of a longitudinal medium changed from 7.5 nm to 20 nm. This FIG. 5 shows the reproduction output when heated, assuming 1 for the reproduction output prior to laser heating. When thermal stability is measured with the measuring apparatus according to the present embodiment, it is clear that at the recording density of 20 kFRPI, as the heating temperature increases to make less stable thermally, as the reproduction output is decreased, lowering magnetization. Moreover, the measurement results obtained by using the apparatus according to the present invention, it can be understood that as the magnetic film has a greater thickness, the medium becomes less stable thermally.

Comparative Example

Figure 6:
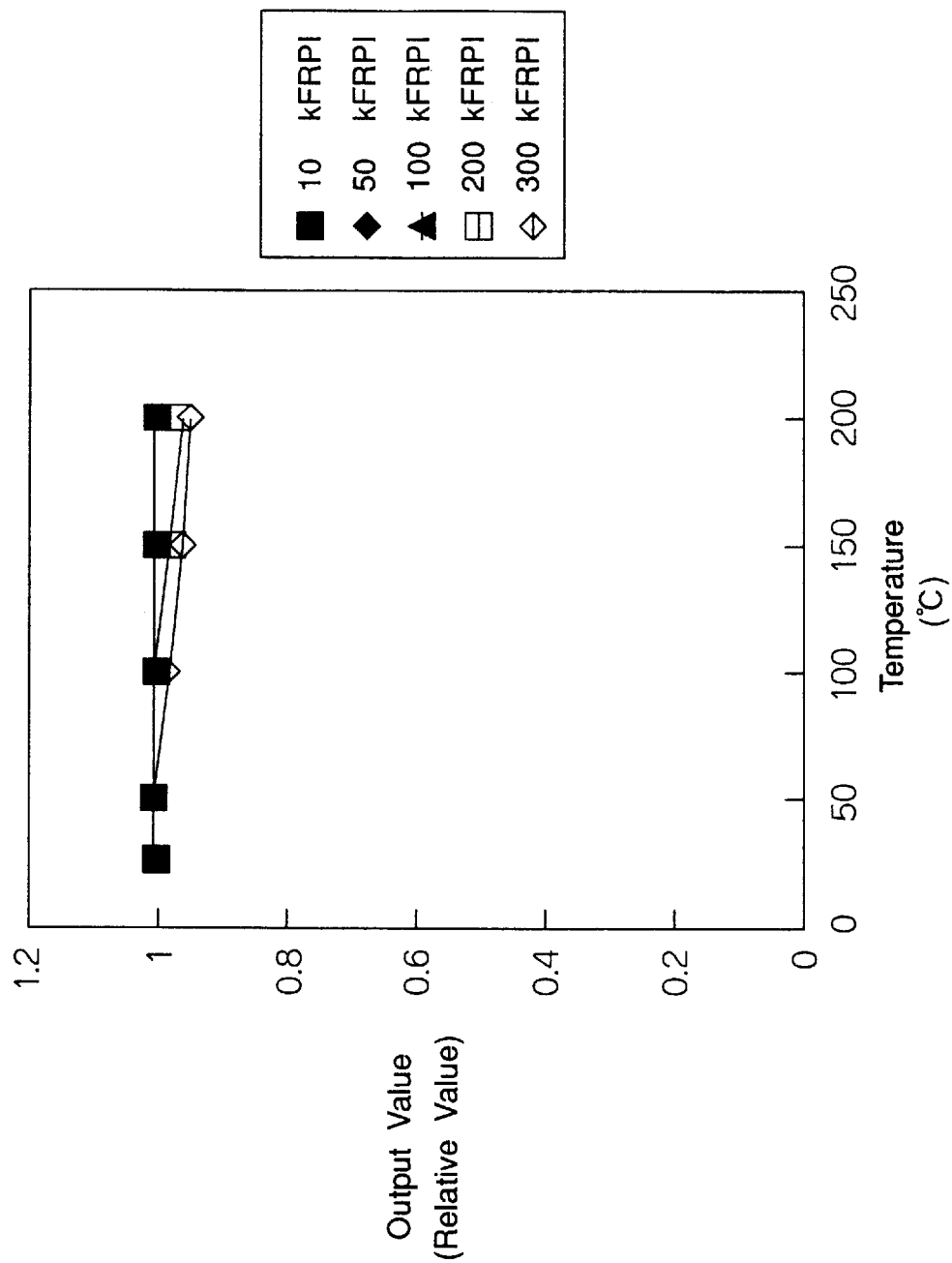
FIG. 6 shows a relationship between a heating temperature and a reproduction output for respective recording densities measured by a conventional method using the MFM.

As a comparative example for Example 1, explanation will be given on results of a conventional measurement carried out by using the MFM. It should be noted that the conventional measurement using the MFM was carried out as follows. An information was recorded with a recording density of 10 to 300 kFRPI on the magnetic recording medium and the stable state at a room temperature was observed by using the MFM to determine the MFM output. After this, the recording medium was heated (annealed) for 1 hour by respective temperatures of 50, 100, 150, 200° C. to make the magnetization unstable. After the heating, the recording medium was cooled down to the room temperature into a quasi-stable magnetization state which was observed by the MFM to determine the MFM output for comparison with the MFM output prior to the heating. That is, the MFM output prior to the heating is assumed to be 1 and the MFM output after the heating is indicated in relation to this, thus enabling to show the magnetization instability due to heating. The results are shown in FIG. 6. According to this conventional measurement method, if the recording density is equal to or below 100 kFRPI, the magnetization pattern recorded stays unchanged when the recording medium is heated to 200° C. or below. Even with the recording density of 300 KFRPI, the demagnetization is equal to or below 5%. This conventional measurement method cannot directly evaluate the unstable magnetization during the heating but can only evaluate the quasi-stable state when the temperature has returned to the room temperature and the instability is mitigated. Accordingly, the actual demagnetization is not measured accurately. FIG. 6 shows that at 300 kFRPI, a difference between the stable state at the room temperature and the quasi-stable state at the room temperature is 5%. Actually, the magnetization during heating to 200° C. is in a more unstable state than the stable state at the room temperature, but this cannot be detected by the conventional measurement method.

Example 2

Example 2 used as the magnetic recording medium 5 a CoCrPtTa/Cr longitudinal NiP/Al substrate medium (3.5–inch magnetic disc) including a Cr layer (under layer) and a CoCrPtTa layer (magnetic film) formed on a NiP/Al layered substrate not transmitting light. The magnetic recording medium had a coercive force of 2000 Oe and Brδ equal to 70 G$\mu$m (wherein Br represents a residual magnetic flux density and δ, a magnetic film thickness). Note that the magnetic film had a thickness of 80 nm.

The magnetic recording/reproduction head 6 used was an ID/MR composite type head. The recording condition was as follows: circumferential velocity 12.7 m/sec; floating amount 45 nm; recording track width 2 $\mu$m with gap length 0.4 $\mu$m; reproduction block track width 1.5 $\mu$m with gap length 0.3 $\mu$m; and recording current amplitude 20 mA$_{op}$.

Figure 7:
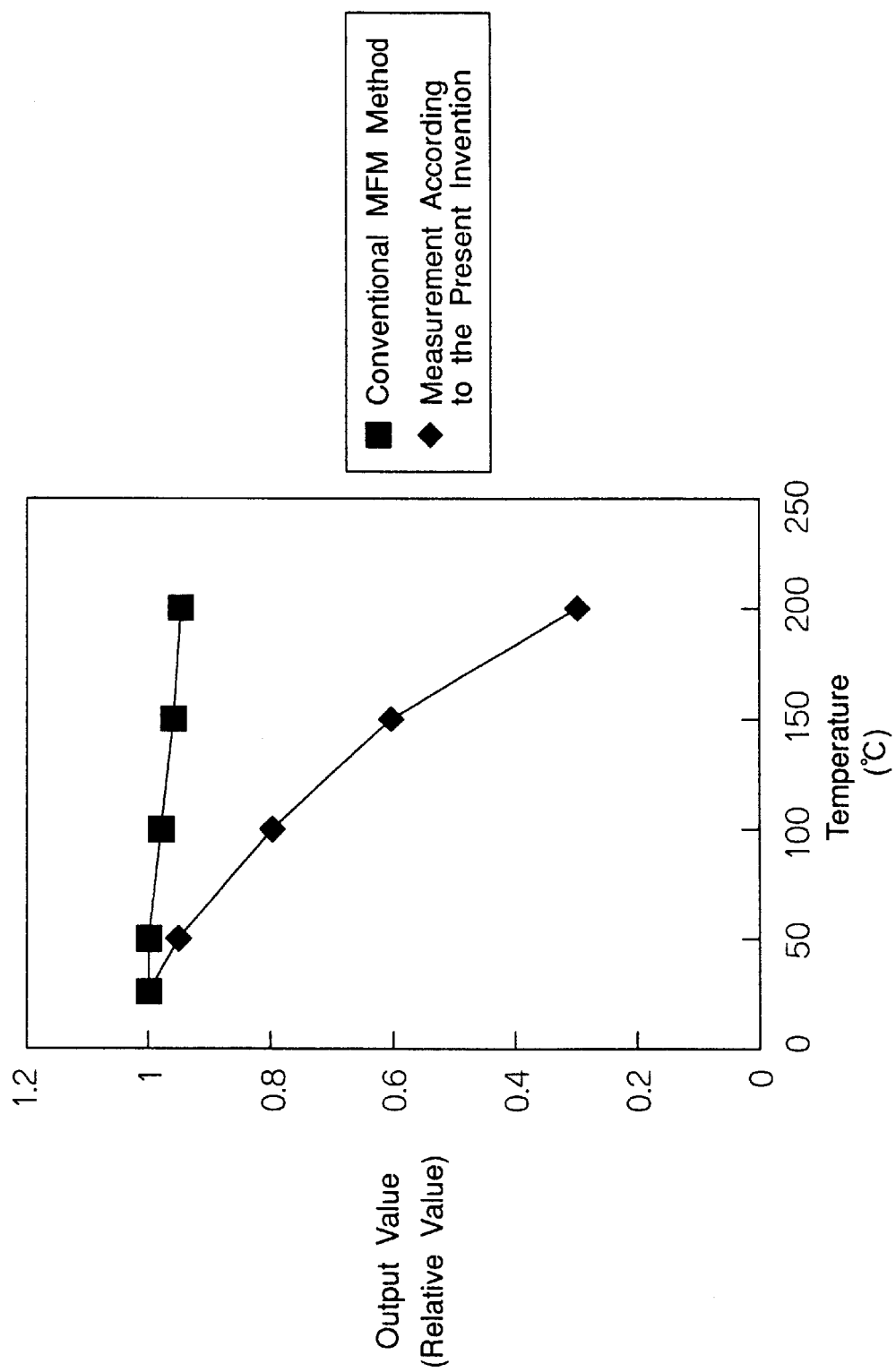
FIG. 7 shows results of thermal stability measurement in Example 2 as a relationship between a heating temperature and a reproduction output in comparison to measurement results obtained by a conventional method using the MFM.

Firstly, a signal of recording density 100 kFRPI was recorded on the magnetic recording medium 5. Next, by using a magneto-optical head (head for radiating a laser having wavelength of 780 nm), the magnetic recording medium 5 was heated from a room temperature up to 200° C. while the magnetic recording was reproduced by a reproduction head 6 and a reproduction output was measured by using measurement means 8. FIG. 7 shows a reproduction output when heated, assuming 1 for a reproduction output prior to laser heating. Moreover, for comparison, a reproduction output of the recording medium was also measured after the medium was returned to the room temperature by using the conventional MFM (assuming 1 for a reproduction output prior to the laser heating). In this conventional measurement method, almost no change in thermal instability was observed. On the contrary, in the measurement method according to the present invention, it was possible to observe a clear change of magnetization becoming less stable as the temperature increased.

Example 3

Figure 8:
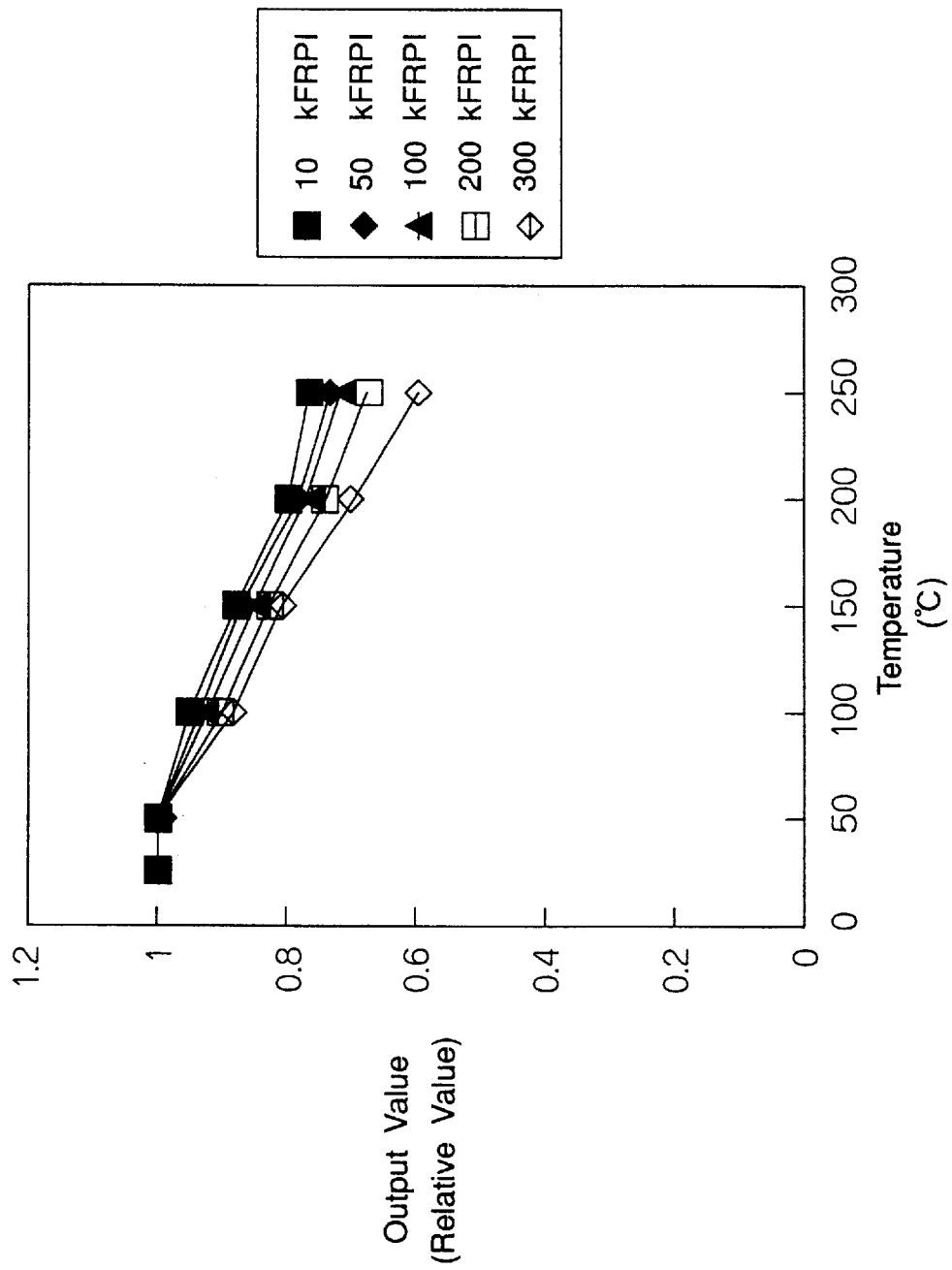
FIG. 8 shows results of thermal stability measurement in Example 3 as a relationship between the heating temperature and the reproduction output for respective recording density values of a longitudinal medium.

By using a magnetic recording medium and a head identical as in Example 1 under the same evaluation condition as in Example 1, thermal stability was measured with various recording density values. FIG. 8 shows a thermal stability (reproduction output dependency on temperature) of a longitudinal medium having a magnetic film of 20 nm thickness in relation to the recording density. This example shows that as the recording density increases, the medium becomes less stable. This tendency is especially accentuated when the heating temperature is increased.

Figure 9:
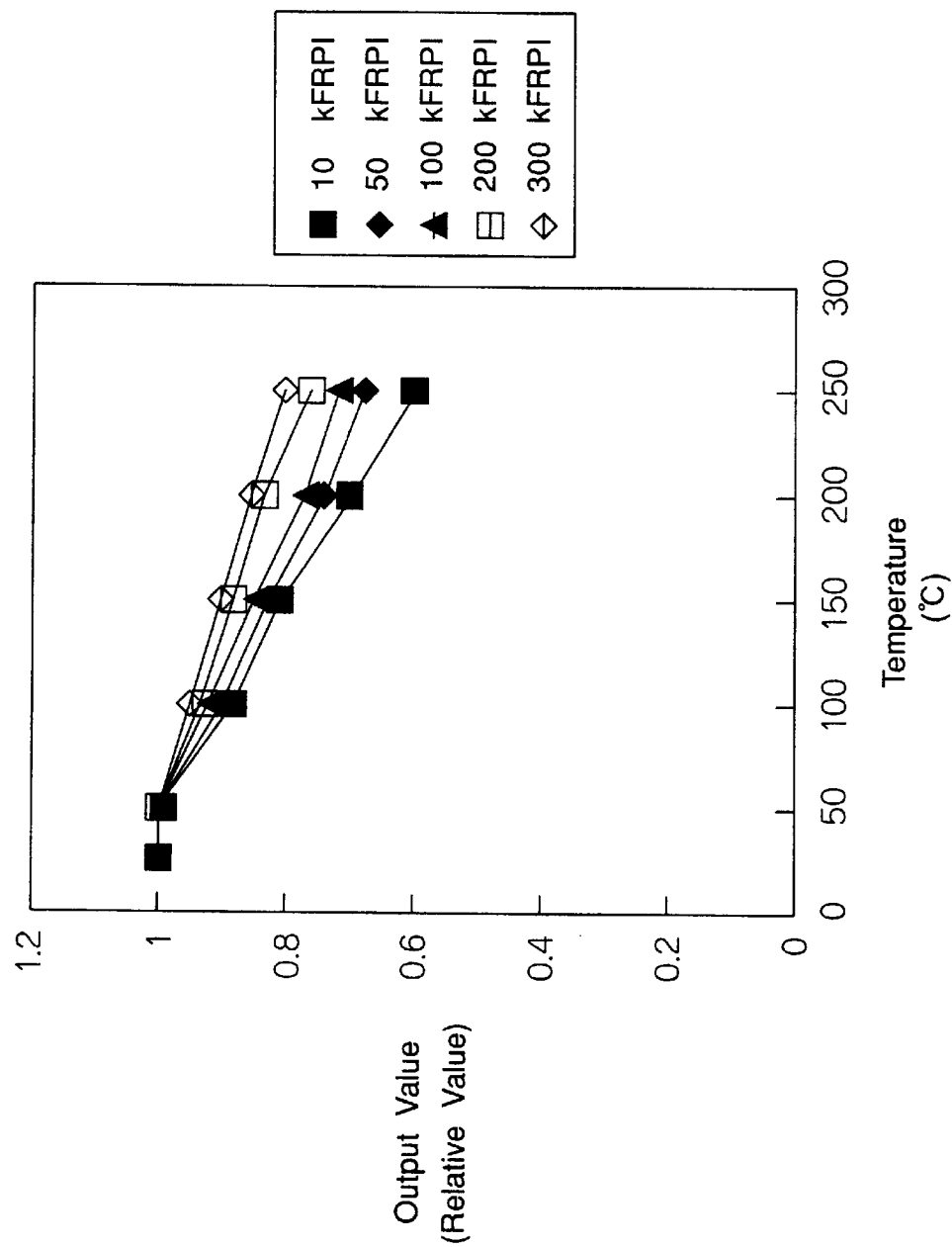
FIG. 9 shows thermal stability measurement results in Example 3 as a relationship between a heating temperature and a reproduction output for respective recording densities of a perpendicular double-layered medium.
Figure 10:
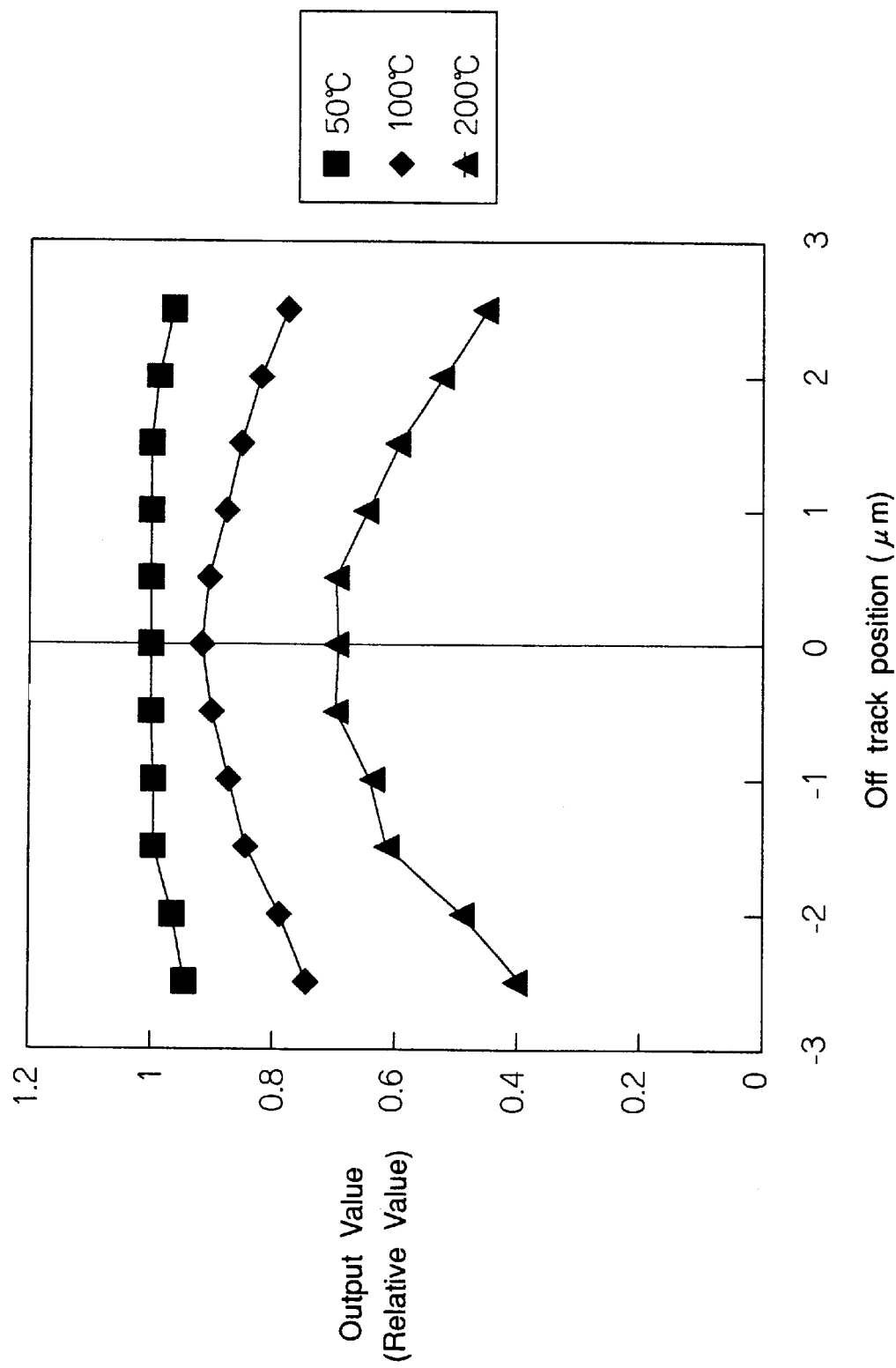
FIG. 10 shows a thermal stability distribution in a fourth embodiment as a relationship between an off-track position and a reproduction output for respective heating temperature values.

Furthermore, the measurement apparatus of this Example was used to measure thermal stability dependency on recording density in a perpendicular double-layered medium. FIG. 9 shows results of this measurement. This measurement shows that in a case of the perpendicular medium, the magnetization becomes thermally stable as the recording density increase. This tendency is especially accentuated as the heating temperature is increased.

Thus, by using the measurement apparatus of this Example, it is possible to determine a thermal stability with an arbitrary recording density both in a longitudinal medium and a perpendicular medium.

Example 4

Example 4 used a CoCrPt/Cr longitudinal glass substrate medium having a coercive force of 2400 Oe. A recording magnetization pattern of 40 kFRPI was formed by using a recording head having a 5 µm track width under the following conditions: circumferential velocity 12.7 mis and floating amount 45 nm. A reproduction output was measured by using a reproduction MR head having a track width of 0.8 µm. Next, by using a magneto-optical head (for radiating a laser beam having a wavelength of 640 nm) 3 provided at the back side of the glass disc opposite to the reproduction head 2, with a laser focus spot diameter set to 0.93 µm, heating was carried out while the magnetic recording was reproduced by the reproduction head 2. Here, while the heating and reproduction was in progress, the two heads 2 and 3 were made to scan in the track width direction to determine a thermal stability distribution in the track width direction. As a result, it was found that the thermal stability is especially deteriorated at the end portion of the track width direction. The reason of this is considered to be that a head recording magnetic field is weak at the end portion of the track width direction and more sensible to a thermal fluctuation. Thus, the measurement apparatus and the measurement method according to the present invention enables to easily determine a thermal stability in the track width direction.

Example 5

Figure 11:
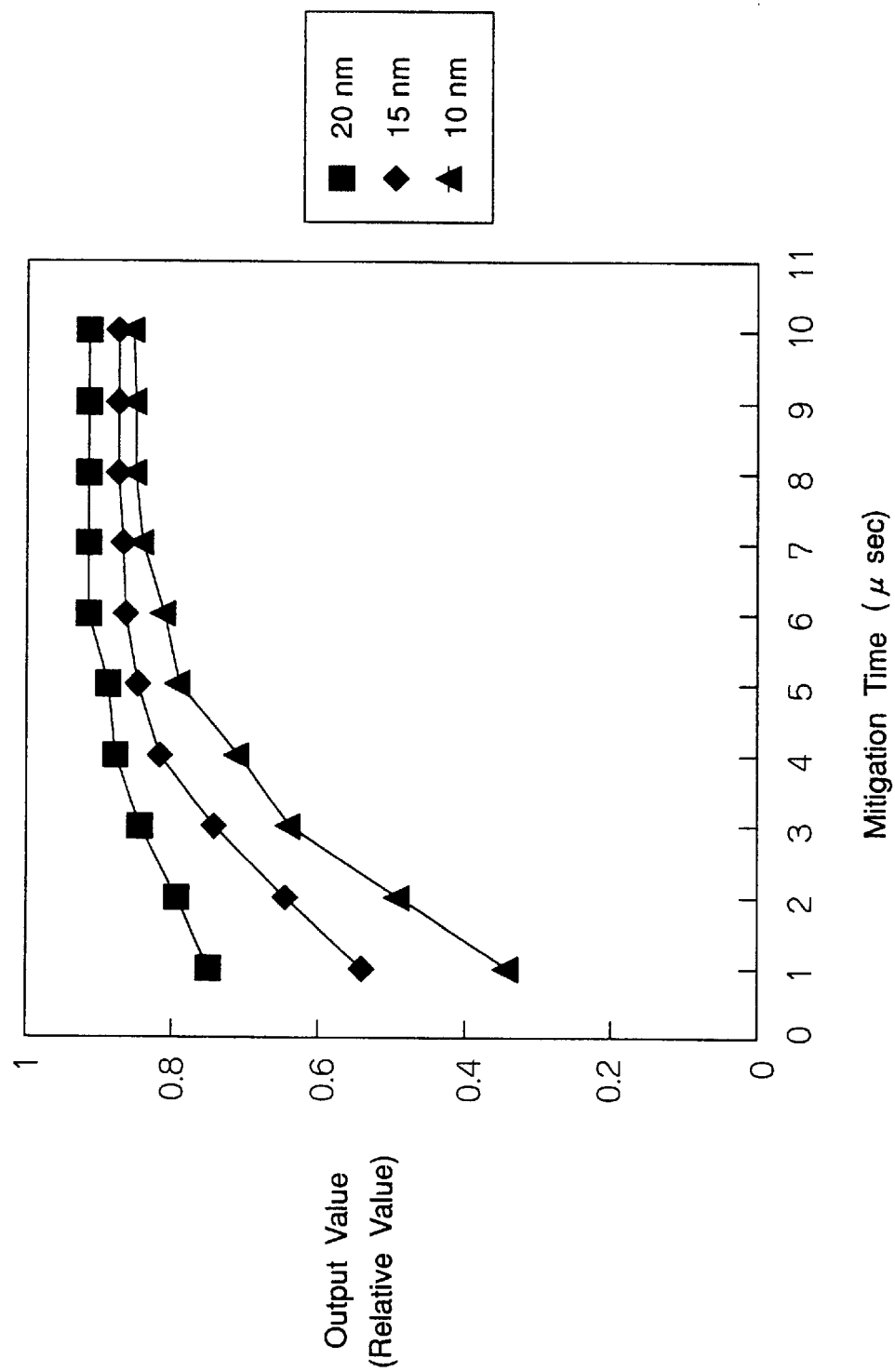
FIG. 11 shows a relationship between a mitigation time and a reproduction output for respective crystal particle diameters indicating instability dependency on the mitigation time in Example 5.

In Example 5, the magneto-optical head 3 radiated a laser beam of wavelength 680 nm and the focus spot diameter was 1 µm. Heating was carried out while shifting the focus positions of the reproduction head 2 and the magneto-optical head 3 in the track circumferential direction. That is, a portion of the magnetic recording medium 1 heated by the magneto-optical head 3 was scanned and reproduced by the reproduction head 2 with a slight timing delay. Thus, the magnetization instability immediately after heating was mitigated when the measurement was made. That is, when heating is carried out for a short period of time (for example, a time equivalent to a scan distance of 1 µm) by the magneto-optical head 3, the recording magnetization becomes unstable, but after a short period of time, thermal mitigation takes place. When the magneto-optical head 3 and the reproduction head 2 are positioned at a distance in the track circumferential direction, each portion heated by the magneto-optical head 3 is scanned by the reproduction head after a short period of time when the thermal instability of the portion is mitigated. In this state, the magnetic recording is reproduced. FIG. 11 shows a reproduction output of a magnetic recording medium having a crystal particle diameter of 10 to 20 nm using as a parameter the instability mitigation time (proportional to a distance between the magneto-optical head 3 and the reproduction head 2). Thus, it can be observed a transition how the thermal instability is mitigated as the time lapses.

As has been described above, according to the present invention, by measuring a reproduction output of a magnetic recording in a stable state of room temperature and a reproduction output of the magnetic recording in an unstable state during heating, it is possible to compare obtained values to clearly determine a thermal stability.

Furthermore, because the present invention enables to carry out a local thermal stability, it is also possible to determine a thermal stability distribution and a thermal instability mitigation without requiring any complicated procedure, which in turn effectively contributes to development of an excellent magnetic recording medium and a head.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-188285 (Filed on Jul. 14, 1997) including specification, claims, drawings and summary are incorporated herein by reference in its entirety.

What is claimed is:

1. A thermal stability measuring method for a magnetic recording medium, said method comprising steps of:
    contact-free heating said magnetic recording medium from a location spaced apart from the medium;
    reproducing an information recorded on said magnetic recording medium;
    measuring a thermal stability according to a reproduction output during said heating; and
    calculating a reproduction output during heating in relation to a reproduction output during non-heating so as to determine an attenuation amount.

2. A thermal stability measuring method for a magnetic recording medium as claimed in claim 1, wherein
    (a) said magnetic recording medium is heated by a predetermined magneto-optical head laser radiation, and
    (b) an information is reproduced from said magnetic recording medium heated, by a reproduction head.

3. A thermal stability measuring method for a magnetic recording medium, said method comprising steps of:
    contact-free heating said magnetic recording medium from a location spaced apart from the medium;
    reproducing an information recorded on said magnetic recording medium; and
    measuring a thermal stability according to a reproduction output during said heating, wherein
    said magnetic recording medium is heated by a predetermined magneto-optical head laser radiation, and
    an information is reproduced from said magnetic recording medium heated, by a predetermined reproduction head, and wherein
    heating is carried out while said magneto-optical head is shifted in a radial direction of said magnetic recording medium;
    an information is reproduced while said reproduction head is shifted in a radial direction of said magnetic recording medium, said reproduction head having a width smaller than a recording track width of said magnetic recording medium and equal to or smaller than said laser spot diameter; and
    according to said reproduction output, a thermal stability of said magnetic recording medium is determined.

4. A thermal stability measuring method for a magnetic recording medium as claimed in claim 2; wherein
    (a) heating is carried out while said magneto-optical head is shifted in a radial direction of said magneto-optical disc;
    (b) an information is reproduced while said reproduction head is shifted in a radial direction of said magnetic recording medium, said magnetic head having a width smaller than a recording track width of said magnetic recording medium and equal to or smaller than said laser spot diameter; and (c) according to said reproduction output, a thermal stability of said magnetic recording medium is determined.

5. A thermal stability measuring method for a magnetic recording medium, said method comprising steps of:

contact-free heating said magnetic recording medium from a location spaced apart from the medium;

reproducing an information recorded on said magnetic recording medium; and measuring a thermal stability according to a reproduction output during said heating, wherein said magnetic recording medium is heated by a predetermined magneto-optical head laser radiation, and an information is reproduced from said magnetic recording medium heated, by a predetermined reproduction head, and wherein a predetermined area of said magnetic recording medium is locally heated by laser radiation of said magneto-optical head so as to change magnetization state thereof;

an information recorded on said magnetic recording medium is reproduced by a predetermined reproduction head; and upon detection of a fluctuation of said reproduction output, shifting of said reproduction head is terminated, thus positioning said reproduction head in relation to said magneto-optical head.

6. A thermal stability measuring apparatus for a magnetic recording medium, said apparatus comprising:

a heater whose position over a magnetic recording medium can be controlled so as to non-contactingly heat the magnetic recording medium from a position spaced apart the magnetic recording medium;

a reproduction head whose position over a magnetic recording medium can be controlled; and an analyzer for determining a reproduction output from said reproduction head so as to analyze a thermal stability, wherein said analyzer determines the thermal stability according to an attenuation amount of a reproduction output during heating in relation to a reproduction output during non-heating.

7. A thermal stability measuring apparatus for a magnetic recording medium, said apparatus comprising:

a heater whose position over a magnetic recording medium can be controlled so as to non-contactingly heat the magnetic recording medium from a position spaced apart the magnetic recording medium;

a reproduction head whose position over a magnetic recording medium can be controlled; and an analyzer for determining a reproduction output from said reproduction head so as to analyze a thermal stability, wherein said heater is a magneto-optical head radiating a laser beam, and said magneto-optical head is shifted in a radial direction of said magnetic recording medium while carrying out heating;

said reproduction head is shifted in a radial direction of said magnetic recording medium while reproducing an information, said reproduction head having a width smaller than a recording track width of said magnetic recording medium and equal to or smaller than said laser beam spot diameter; and said reproduction output is used to determine a thermal stability of said recording medium.

* * * * *